United States Patent
Khlat

(10) Patent No.: US 10,879,795 B2
(45) Date of Patent: Dec. 29, 2020

(54) POWER MANAGEMENT CIRCUIT WITH DUAL CHARGE PUMP STRUCTURE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/662,699

(22) Filed: Oct. 24, 2019

(65) Prior Publication Data

US 2020/0381996 A1 Dec. 3, 2020

Related U.S. Application Data

(60) Provisional application No. 62/854,573, filed on May 30, 2019.

(51) Int. Cl.
*H02M 3/07* (2006.01)
*H03F 3/24* (2006.01)

(52) U.S. Cl.
CPC ............. *H02M 3/07* (2013.01); *H03F 3/24* (2013.01); *H03F 2200/102* (2013.01); *H03F 2200/451* (2013.01)

(58) Field of Classification Search
CPC ...... H02M 3/07; H03F 3/24; H03F 2200/102; H03F 2200/451
USPC ......................................................... 327/536
See application file for complete search history.

(56) References Cited

U.S. PATENT DOCUMENTS

| | | | |
|---|---|---|---|
| 7,994,864 B2 | 8/2011 | Chen et al. | |
| 9,362,818 B2 * | 6/2016 | Gorisse | ................ H02M 3/07 |
| 9,374,005 B2 | 6/2016 | Rozek et al. | |
| 2012/0170334 A1 | 7/2012 | Menegoli et al. | |
| 2019/0356285 A1 | 11/2019 | Khlat et al. | |

OTHER PUBLICATIONS

Non-Final Office Action for U.S. Appl. No. 16/237,141, dated Apr. 3, 2020, 14 pages.

* cited by examiner

*Primary Examiner* — John W Poos
(74) *Attorney, Agent, or Firm* — Withrow & Terranova, P.L.L.C.

(57) ABSTRACT

The present disclosure relates to a power management circuit (PMC) with a dual charge pump (DCP) structure. The DCP structure includes a first switch network having a first capacitor, a second switch network having a second capacitor, and a connection switch coupled between the first switch network and the second switch network. Herein, the first capacitor and the second capacitor are electrically coupled in series between a battery terminal and a ground terminal or electrically coupled in parallel between the battery terminal and the ground terminal during a charging phase. The first capacitor and the second capacitor are electrically coupled in series between the battery terminal and a pump output terminal, or electrically coupled in parallel between the battery terminal and the pump output terminal, or electrically coupled in parallel between the ground terminal and the pump output terminal during a discharging phase.

19 Claims, 7 Drawing Sheets

POWER MANAGEMENT CIRCUIT WITH DUAL CHARGE PUMP STRUCTURE

RELATED APPLICATIONS

This application claims the benefit of provisional patent application Ser. No. 62/854,573, filed May 30, 2019, the disclosure of which is hereby incorporated herein by reference in its entirety.

FIELD OF THE DISCLOSURE

The present disclosure relate to a power management circuit (PMC) for supplying power to radio frequency (RF) amplifiers, and more particularly to a PMC with a dual charge pump structure that is capable of providing multiple voltage levels.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies. To achieve higher data rates in mobile communication devices, sophisticated power amplifiers (PAs) may be employed in radio frequency (RF) front-end circuitry to increase output power of RF signals (e.g., maintaining sufficient energy per bit) communicated by mobile communication devices. However, increased output power of RF signals can lead to increased power consumption and thermal dissipation in mobile communication devices, thus compromising overall performance and user experience. As such, the mobile communication devices may employ power management technologies to help improve efficiency levels of PAs. In this regard, efficiency of a power management circuit (PMC) may impact overall power consumption and performance of mobile communication devices. Accordingly, it is an object of the present disclosure to design an improved PMC that is capable of providing power to PAs in an efficient and flexible way.

SUMMARY

The present disclosure relates to a power management circuit (PMC) with a dual charge pump (DCP) structure that is capable of providing multiple voltage levels. The DCP structure includes a first switch network having a first capacitor, a second switch network having a second capacitor, and a connection switch coupled between the first switch network and the second switch network. Herein, the first capacitor and the second capacitor are electrically coupled in series between a battery terminal and a ground terminal or electrically coupled in parallel between the battery terminal and the ground terminal during a charging phase. The first capacitor and the second capacitor are electrically coupled in series between the battery terminal and a pump output terminal, or electrically coupled in parallel between the battery terminal and the pump output terminal, or electrically coupled in parallel between the ground terminal and the pump output terminal during a discharging phase. The battery terminal is configured to provide a battery voltage, and the ground terminal is electrically coupled to ground.

In one embodiment of the PMC, the pump output terminal is configured to provide a charge pump output voltage, which is a half of, 1.5 times, 2 times, or 3 times the battery voltage.

In one embodiment of the PMC, the first capacitor and the second capacitor are electrically coupled in series between the battery terminal and the ground terminal during the charging phase, and the first capacitor and the second capacitor are electrically coupled in parallel between the battery terminal and the pump output terminal during the discharging phase.

In one embodiment of the PMC, the first capacitor and the second capacitor are electrically coupled in series between the battery terminal and the ground terminal during the charging phase, and the first capacitor and the second capacitor are electrically coupled in parallel between the ground terminal and the pump output terminal during the discharging phase.

In one embodiment of the PMC, the first capacitor and the second capacitor are electrically coupled in parallel between the battery terminal and the ground terminal during the charging phase, and the first capacitor and the second capacitor are electrically coupled in series between the battery terminal and the pump output terminal during the discharging phase.

In one embodiment of the PMC, the first capacitor and the second capacitor are electrically coupled in parallel between the battery terminal and the ground terminal during the charging phase, and the first capacitor and the second capacitor are electrically coupled in parallel between the battery terminal and the pump output terminal during the discharging phase.

In one embodiment of the PMC, the first capacitor has a same capacitance as the second capacitor.

In one embodiment of the PMC, the first switch network further includes a first switch, a second switch, a third switch, and a fourth switch. Herein, the first capacitor is coupled between a first flying node and a second flying node. The first switch is coupled between the battery terminal and the first flying node, such that the battery terminal is connected to the first flying node when the first switch is closed. The second switch is coupled between the first flying node and the pump output terminal, such that the first flying node is connected to the pump output terminal when the second switch is closed. The third switch is coupled between the battery terminal and the second flying node, such that the battery terminal is connected to the second flying node when the third switch is closed. The fourth switch is coupled between the second flying node and the ground terminal, such that the second flying node is connected to the ground terminal when the fourth switch is closed.

In one embodiment of the PMC, the second switch network further includes a fifth switch, a sixth switch, a seventh switch, and an eighth switch. Herein, the second capacitor is coupled between a third flying node and a fourth flying node. The fifth switch is coupled between the battery terminal and the third flying node, such that the battery terminal is connected to the third flying node when the fifth switch is closed. The sixth switch is coupled between the third flying node and the pump output terminal, such that the third flying node is connected to the pump output terminal when the sixth switch is closed. The seventh switch is coupled between the battery terminal and the fourth flying node, such that the battery terminal is connected to the fourth flying node when the seventh switch is closed. The eighth switch is coupled between the fourth flying node and the ground terminal, such that the fourth flying node is connected to the ground terminal when the eighth switch is closed.

In one embodiment of the PMC, the connection switch is coupled between the second flying node and the third flying node, such that the first capacitor and the second capacitor are coupled in series when the connection switch is closed.

In one embodiment of the PMC, the connection switch, the first switch, the second switch, the third switch, the fourth switch, the fifth switch, the sixth switch, the seventh switch, and the eighth switch are field-effect transistors (FETs).

In one embodiment of the PMC, the connection switch, the first switch, the second switch, the third switch, the fourth switch, the fifth switch, the sixth switch, the seventh switch, and the eighth switch are microelectromechanical system switches.

According to another embodiment, the PMC further includes a switch controller, which is configured to control the opening and closing of the connection switch, the first switch, the second switch, the third switch, the fourth switch, the fifth switch, the sixth switch, the seventh switch, and the eighth switch.

According to another embodiment, the PMC further includes a power inductor coupled between the pump output terminal and a power supply terminal. Herein, the power inductor is configured to filter power flowing between the pump output terminal and the power supply terminal.

According to another embodiment, the PMC further includes a battery switch and a ground switch. Herein, the power inductor is coupled to the pump output terminal at an interior node. The battery switch is coupled between the battery terminal and the interior node, such that the battery terminal is electrically coupled to the power inductor when the battery switch is closed. The ground switch is coupled between the interior node and ground, such that the ground terminal is electrically coupled to the power inductor when the ground switch is closed.

According to another embodiment, the PMC further includes a switch controller, which is configured to conduct current to the power inductor from one of the pump output terminal, the battery terminal, and the ground terminal.

According to another embodiment, the PMC further includes a tracking amplifier. The tracking amplifier includes a first input port, a second input port, and an output port. The first input port is coupled to the power supply terminal to receive a feedback signal, and the second input port is configured to receive a target voltage. The output port is coupled to the power supply terminal, and configured to provide an amplified voltage in response to a difference between the target voltage and the feedback signal.

According to another embodiment, the PMC further includes an offset capacitor coupled between the output port of the tracking amplifier and the power supply terminal. Herein, the offset capacitor is configured to provide an offset voltage to increase a dynamic range of the amplified voltage.

According to another embodiment, the PMC further includes a mode switch coupled between the output port of the tracking amplifier and the ground terminal. Herein, the mode switch is configured to enable or disable the tracking amplifier.

According to another embodiment, the PMC further includes a switch controller, which is configured to control the opening and closing of the mode switch.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
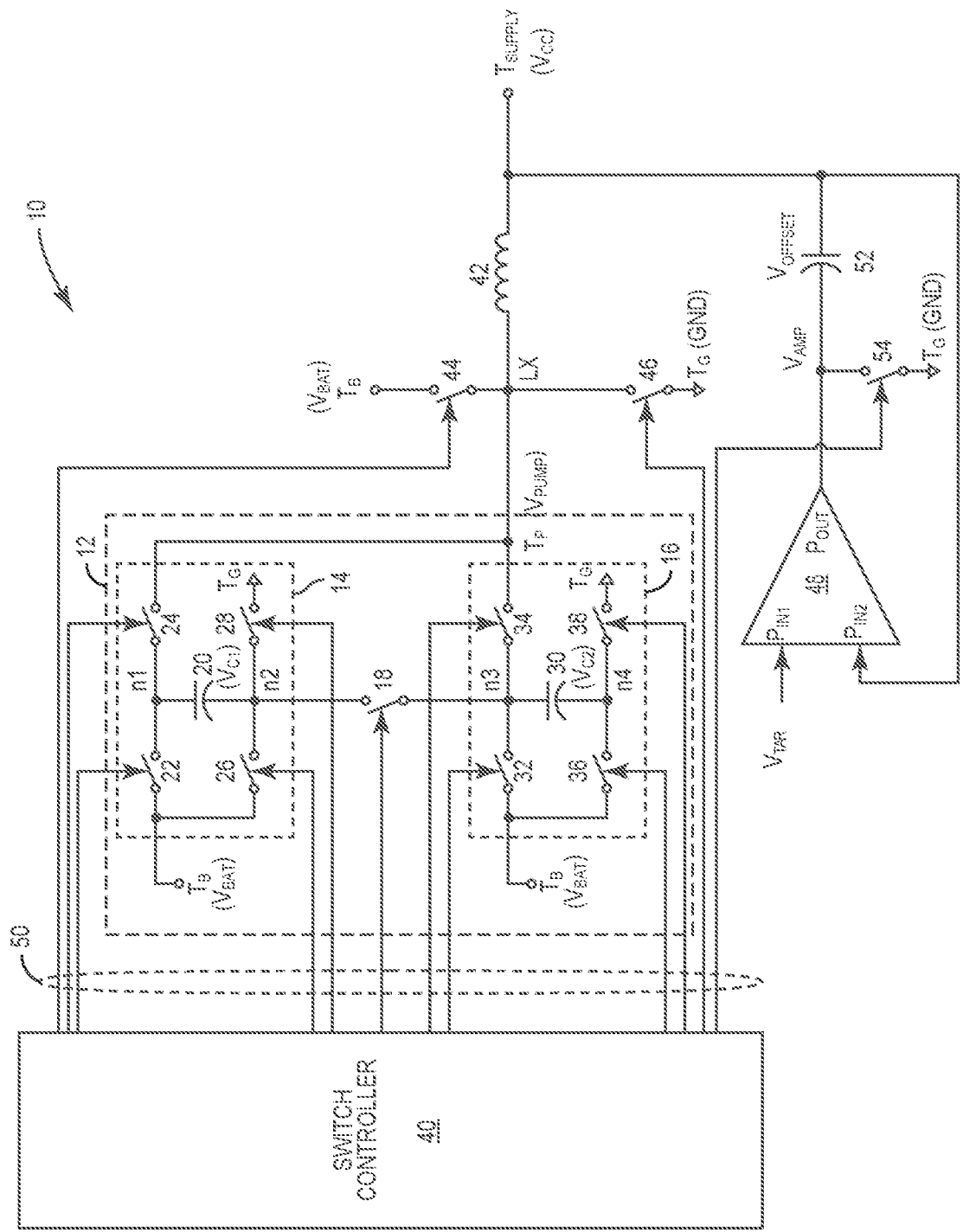
FIG. 1 show an exemplary power management circuit (PMC) with a dual charge pump (DCP) structure according to one embodiment of the present disclosure.

It will be understood that for clear illustrations, FIGS. 1-5B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a power management circuit (PMC) with a dual charge pump (DCP) structure that is capable of providing multiple voltage levels. FIG. 1 shows an exemplary PMC 10 with a DCP structure 12 according to one embodiment of the present disclosure. The DCP structure 12 includes a first switch network 14, a second switch network 16, and a connection switch 18 coupled between the first switch network 14 and the second switch network 16.

In detail, the first switch network 14 includes a first capacitor 20 and four switches, a first switch 22, a second switch 24, a third switch 26, and a fourth switch 28. The first capacitor 20 is coupled between a first flying node n1 and a second flying node n2. The first switch 22 is coupled between a battery terminal $T_B$ and the first flying node n1, such that the battery terminal $T_B$ is connected to the first flying node n1 when the first switch 22 is closed. Herein, the battery terminal $T_B$ is configured to provide a battery voltage $V_{BAT}$. The second switch 24 is coupled between the first flying node n1 and a pump output terminal $T_P$, such that the first flying node n1 is connected to the pump output terminal $T_P$ when the second switch 24 is closed. The pump output terminal $T_P$ is configured to provide a charge pump output voltage $V_{PUMP}$, which is related to the battery voltage $V_{BAT}$. The third switch 26 is coupled between the battery terminal $T_B$ and the second flying node n2, such that the battery terminal $T_B$ is connected to the second flying node n2 when the third switch 26 is closed. The fourth switch 28 is coupled between the second flying node n2 and a ground terminal $T_G$, such that the second flying node n2 is connected to the ground terminal $T_G$ when the fourth switch 28 is closed. The ground terminal $T_G$ is electrically coupled to ground.

Similarly, the second switch network 16 includes a second capacitor 30 and four switches, a fifth switch 32, a sixth switch 34, a seventh switch 36, and an eighth switch 38. The second capacitor 30 is coupled between a third flying node n3 and a fourth flying node n4. The fifth switch 32 is coupled between the battery terminal $T_B$ and the third flying node n3, such that the battery terminal $T_B$ is connected to the third flying node n3 when the fifth switch 32 is closed. The sixth switch 34 is coupled between the third flying node n3 and the pump output terminal $T_P$, such that the third flying node n3 is connected to the pump output terminal $T_P$ when the sixth switch 34 is closed. The seventh switch 36 is coupled between the battery terminal $T_B$ and the fourth flying node n4, such that the battery terminal $T_B$ is connected to the fourth flying node n4 when the seventh switch 36 is closed. The eighth switch 38 is coupled between the fourth flying node n4 and the ground terminal $T_G$, such that the fourth flying node n4 is connected to the ground terminal $T_G$ when the eighth switch 38 is closed.

In addition, the connection switch 18 is coupled between the second flying node n2 and the third flying node n3, such that the first capacitor 20 in the first switch network 14 and the second capacitor 30 in the second switch network 16 are coupled in series when the connection switch 18 is closed. In some applications for instance, a voltage endurance of the connection switch 18 is relatively small, and there may be more than one connection switch 18 stacked in series between the second flying node n2 and the third flying node n3 (not shown).

Besides the DCP structure 12, the PMC 10 further includes a switch controller 40, a power inductor 42, a battery switch 44, a ground switch 46, and a tracking amplifier 48. The switch controller 40 is configured to control the opening and closing of the connection switch 18, the first switch 22, the second switch 24, the third switch 26, the fourth switch 28, the fifth switch 32, the sixth switch 34, the seventh switch 36, and the eighth switch 38, respectively.

In particular, the switch controller 40 may have a control bus 50 communicatively coupled to control terminals of the connection switch 18, the first switch 22, the second switch 24, the third switch 26, the fourth switch 28, the fifth switch 32, the sixth switch 34, the seventh switch 36, and the eighth switch 38. In one embodiment, the connection switch 18, the first switch 22, the second switch 24, the third switch 26, the fourth switch 28, the fifth switch 32, the sixth switch 34, the seventh switch 36, and the eighth switch 38 are field-effect transistors (FETs), wherein the control terminals are FET gate terminals coupled to the control bus 50 of the switch controller 40. In another embodiment, the connection switch 18, the first switch 22, the second switch 24, the third switch 26, the fourth switch 28, the fifth switch 32, the sixth switch 34, the seventh switch 36, and the eighth switch 38 are microelectromechanical system switches, wherein the control terminals are microelectromechanical system gate terminals coupled to the control bus 50 of the switch controller 40.

The power inductor 42 is coupled between the pump output terminal $T_P$ of the DCP structure 12 and a power supply terminal $T_{SUPPLY}$, which is configured to provide a power supply $V_{CC}$ to a power amplifier in a radio frequency (RF) transceiver (not shown). The power inductor 42 provides filtering of power generated by the DCP structure 12. In particular, the power inductor 42 is configured to filter power flowing between the pump output terminal $T_P$ of the DCP structure 12 and the power supply terminal $T_{SUPPLY}$.

Herein, the power inductor 42 is coupled to the pump output terminal $T_P$ of the DCP structure 12 at an interior node LX. The battery switch 44 and the ground switch 46 are also coupled to the interior node LX. The battery switch 44 is coupled between the battery terminal $T_B$ and the interior node LX, such that the battery terminal $T_B$ is electrically coupled to the power inductor 42 when the battery switch 44 is closed. The ground switch 46 is coupled between the interior node LX and the ground terminal $T_G$, such that the ground terminal $T_G$ is electrically coupled to the power inductor 42 when the ground switch $T_G$ is closed. Control terminals of the battery switch 44 and the ground switch 46 may be also coupled to the control bus 50 of the switch controller 40. In some embodiments, the switch controller 40 is configured to momentarily selectively close the battery switch 44 and the ground switch 46 in an alternating sequence to maintain current flow through the power inductor 42 (more details are described later).

In some applications, if a voltage endurance of the battery switch 44 is smaller than the battery voltage $V_{BAT}$, there may be two or more battery switches 44 stacked in series between the battery terminal $T_B$ and the interior node LX (not shown). Similarly, there may be two or more ground switches 46 stacked in series between the interior node LX and ground (not shown). In one embodiment, the battery switch 44 and the ground switch 46 are FETs, wherein their control terminals are FET gate terminals coupled to the control bus 50 of the switch controller 40. In another embodiment, the battery switch 44 and the ground switch 46 are microelectromechanical system switches, wherein their control terminals are microelectromechanical system gate terminals coupled to the control bus 50 of the switch controller 40.

The tracking amplifier 48 has a first input port $P_{IN1}$ coupled to the power supply terminal $T_{SUPPLY}$ to receive the power supply $V_{CC}$ as a feedback signal. The tracking amplifier 48 further includes a second input port $P_{IN2}$ to receive a target voltage $V_{TAR}$, and an output port $P_{OUT}$ to provide an amplified voltage $V_{AMP}$. The amplified voltage $V_{AMP}$ is a scaled difference between the feedback power supply $V_{CC}$ and the target voltage $V_{TAR}$. In a non-limiting example, the output port $P_{OUT}$ of the tracking amplifier 48 is coupled to the power supply terminal $T_{SUPPLY}$ via an offset capacitor 52, which is configured to provide an offset voltage $V_{OFFSET}$ to increase the dynamic range of the amplified voltage $V_{AMP}$ in order to reduce the maximum voltage needed to supply the tracking amplifier 48, and thereby further increase efficiency. If the output port $P_{OUT}$ of the tracking amplifier 48 is coupled directly to the power supply terminal $T_{SUPPLY}$ without the offset capacitor 52, the power supply $V_{CC}$ will be the same as the amplified voltage $V_{AMP}$.

In one embodiment, a mode switch 54 may be coupled between the output port $P_{OUT}$ of the tracking amplifier 48 and the ground terminal $T_G$. A control terminal of the mode switch 54 is coupled to the control bus 50 of the switch controller 40. The switch controller 40 is configured to close the mode switch 54 when the tracking amplifier 48 is disabled and open the mode switch 54 when the tracking amplifier 48 is enabled. The tracking amplifier 48 is enabled during a higher power demand operation such as an average power tracking (APT) operation and disabled during a lower power demand operation such as an envelope tracking (ET) operation.

Figure 2:
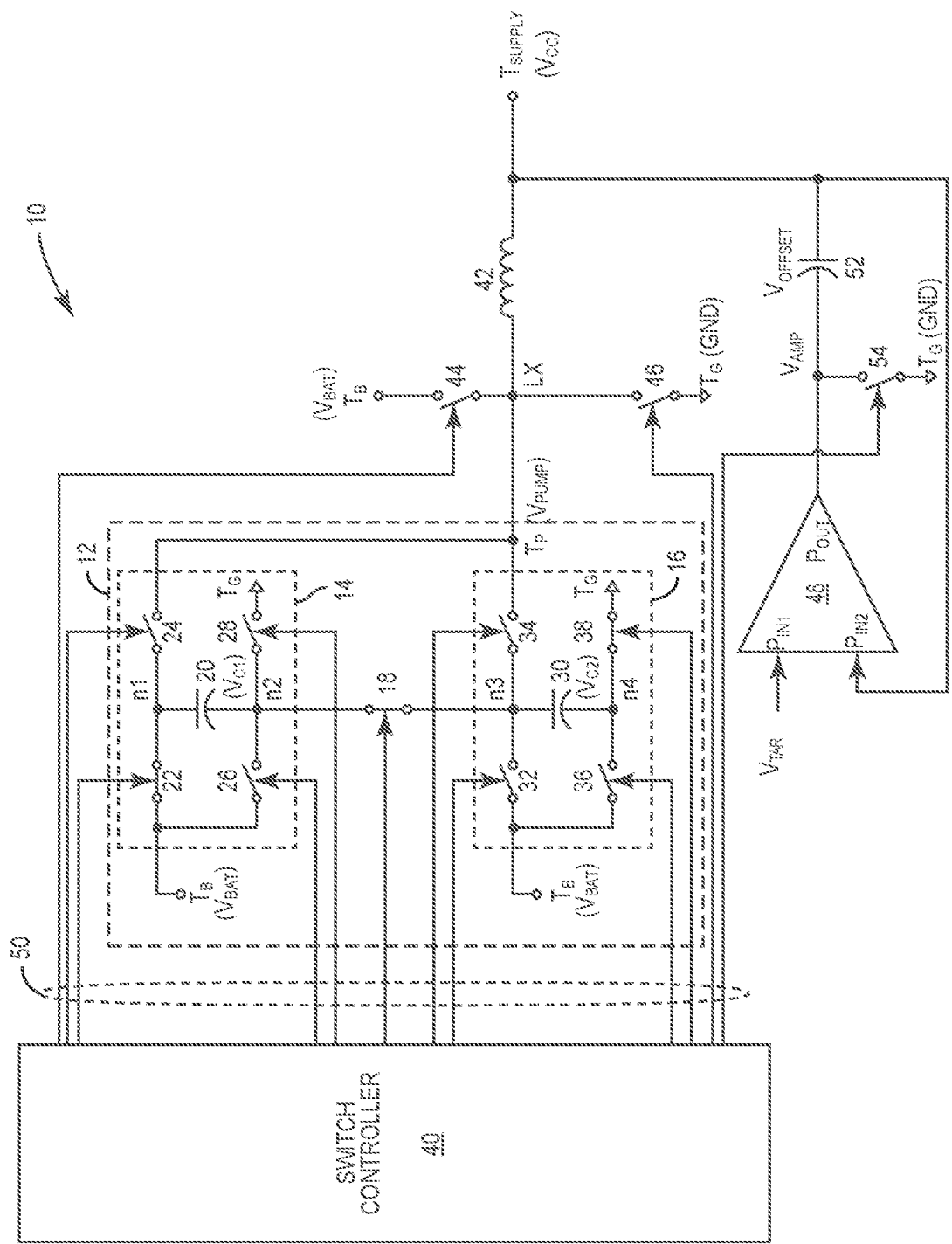
FIGS. 2-5B show operation phases of the PMC illustrated in FIG. 1.

FIG. 2 shows an exemplary configuration of the DCP structure 12 during a charging phase. The switch controller 40 commands the first switch 22, the connection switch 18 and the eighth switch 38 to close, and the second switch 24, the third switch 26, the fourth switch 28, the fifth switch 32, the sixth switch 34, and the seventh switch 36 to open. As such, the first capacitor 20 and the second capacitor 30 are electrically coupled in series between the battery terminal $T_B$ and the ground terminal $T_G$. The battery terminal $T_B$ is connected to the first flying node n1, the second flying node n2 is connected to the third flying node n3, and the fourth flying node n3 is connected to the ground terminal $T_G$. When the first capacitor 20 has a same capacitance as the second capacitor 30, each of the first capacitor 20 and the second capacitor 30 will be charged about the same. In this embodiment, a first capacitor voltage $V_{c1}$ between the first flying node n1 and the second flying node n2 (across the first capacitor 20) is about half the battery voltage $V_{BAT}$, and a second capacitor voltage $V_{c2}$ between the third flying node n1 and the fourth flying node n2 (across the second capacitor 30) is also about half the battery voltage $V_{BAT}$. During the charging phase, the DCP structure 12 does not provide the charge pump output voltage $V_{PUMP}$ to the interior node LX.

Figure 3A:
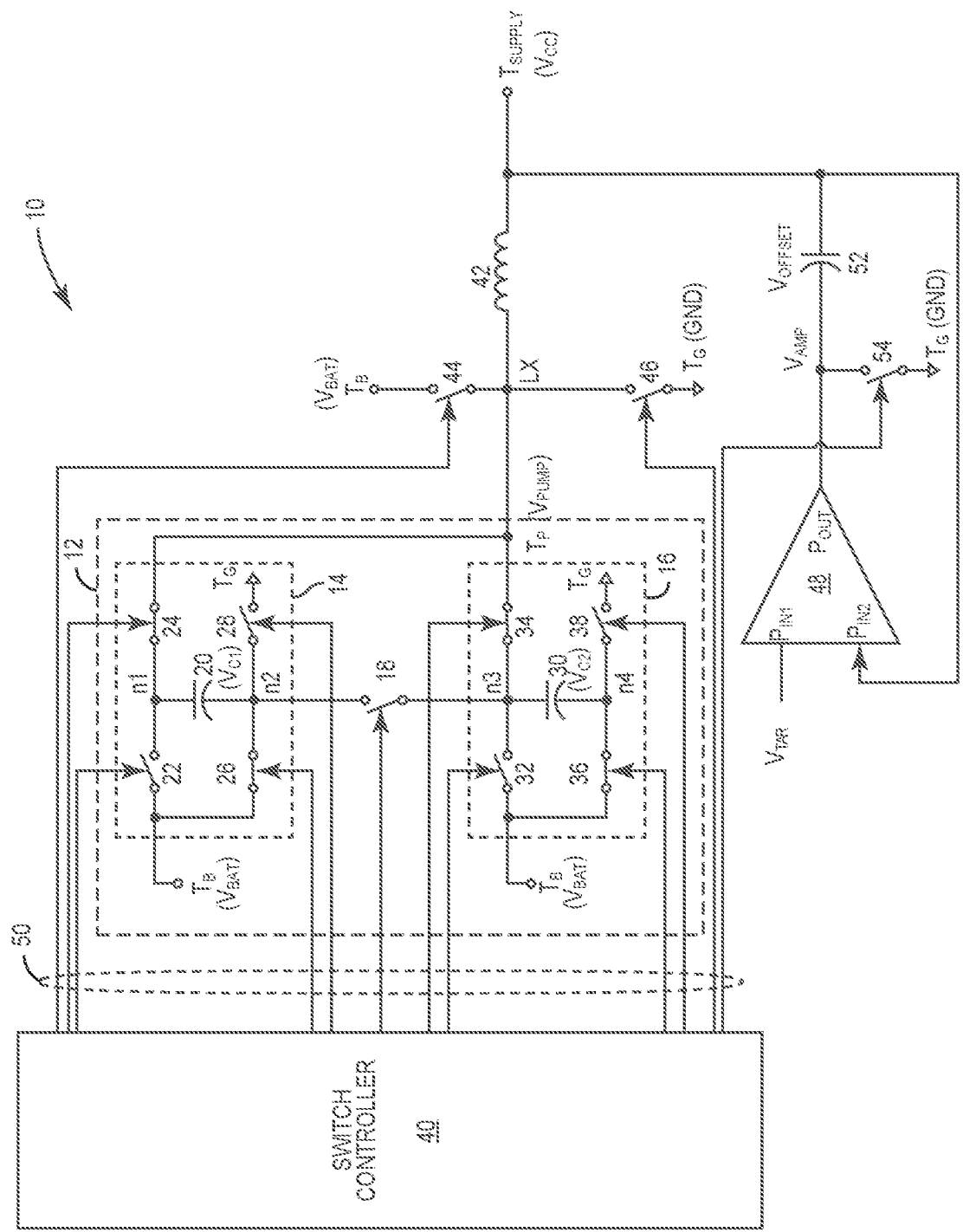

FIG. 3A shows an exemplary configuration of the DCP structure 12 in a discharging phase, during which the DCP structure 12 is configured to provide the charge pump output voltage $V_{PUMP}$ to the interior node LX. Herein, the switch controller 40 commands the second switch 24, the third switch 26, the sixth switch 34, and the seventh switch 36 to close, and the first switch 22, the fourth switch 28, the connection switch 18, the fifth switch 32, and the eighth switch 38 to open. As such, the first capacitor 20 and the second capacitor 22 are electrically coupled in parallel. Each of the first capacitor 20 and the second capacitor 22 is coupled between the battery terminal $T_B$ and the pump output terminal $T_P$. The second flying node n2 is connected to the battery terminal $T_B$, the voltage level at the second flying node n2 will change to equal the battery voltage $V_{BAT}$, and the first flying node n1 will be boosted to 1.5* the battery voltage $V_{BAT}$ (since the first capacitor voltage $V_{c1}$ is charged to equal half the battery voltage $V_{BAT}$ during the charging phase, and cannot change instantly). Similarly, the fourth flying node n4 is connected to the battery terminal $T_B$, the voltage level at the fourth flying node n4 will change to equal the battery voltage $V_{BAT}$, and the third flying node n3 will be boosted to 1.5* the battery voltage $V_{BAT}$ (since the second capacitor voltage $V_{c2}$ is charged to equal half the battery voltage $V_{BAT}$ during the charging phase, and cannot change instantly). Herein, the first flying node n1 and the third flying node n3 are connected to the pump output terminal $T_P$, such that the charge pump output voltage $V_{PUMP}$ provided at the pump output terminal $T_P$ is about 1.5 times the battery voltage $V_{BAT}$.

Figure 3B:
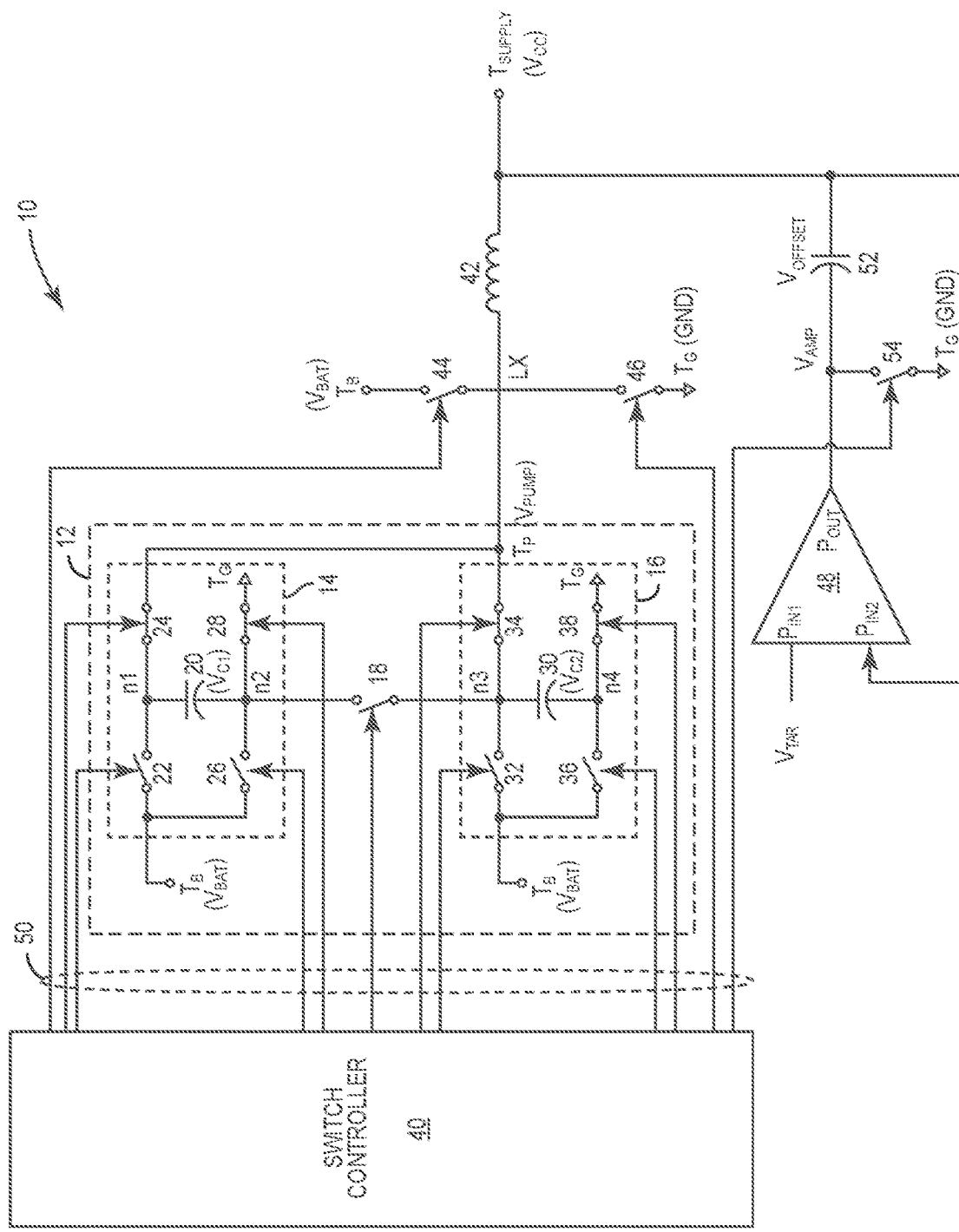

In some applications, the second flying node n2 and the fourth flying node n4 are connected to the ground terminal $T_G$ instead of the battery terminal $T_B$ during the discharging phase. As illustrated in FIG. 3B, the switch controller 40 commands the second switch 24, the fourth switch 28, the sixth switch 34, and the eighth switch 38 to close, and the first switch 22, the third switch 26, the connection switch 18, the fifth switch 32, and the seventh switch 36 to open. As such, the first capacitor 20 and the second capacitor 22 are electrically coupled in parallel. Each of the first capacitor 20 and the second capacitor 22 is coupled between the ground terminal $T_G$ and the pump output terminal $T_P$. The second flying node n2 is connected to the ground terminal $T_B$, the voltage level at the second flying node n2 remains at zero, and the first flying node n1 remains at half the battery voltage $V_{BAT}$ (since the first capacitor voltage $V_{c1}$ is charged to equal half the battery voltage $V_{BAT}$ during the charging phase, and cannot change instantly). Similarly, the fourth flying node n4 is connected to the ground terminal $T_G$, the voltage level at the fourth flying node n4 remains at zero, and the third flying node n3 remains at half the battery voltage $V_{BAT}$ (since the second capacitor voltage $V_{c2}$ is charged to equal half the battery voltage $V_{BAT}$ during the charging phase, and cannot change instantly). Herein, the first flying node n1 and the third flying node n3 are connected to the pump output terminal $T_P$, such that the charge pump output voltage $V_{PUMP}$ provided at the pump output terminal $T_P$ is about half the battery voltage $V_{BAT}$.

Figure 4:
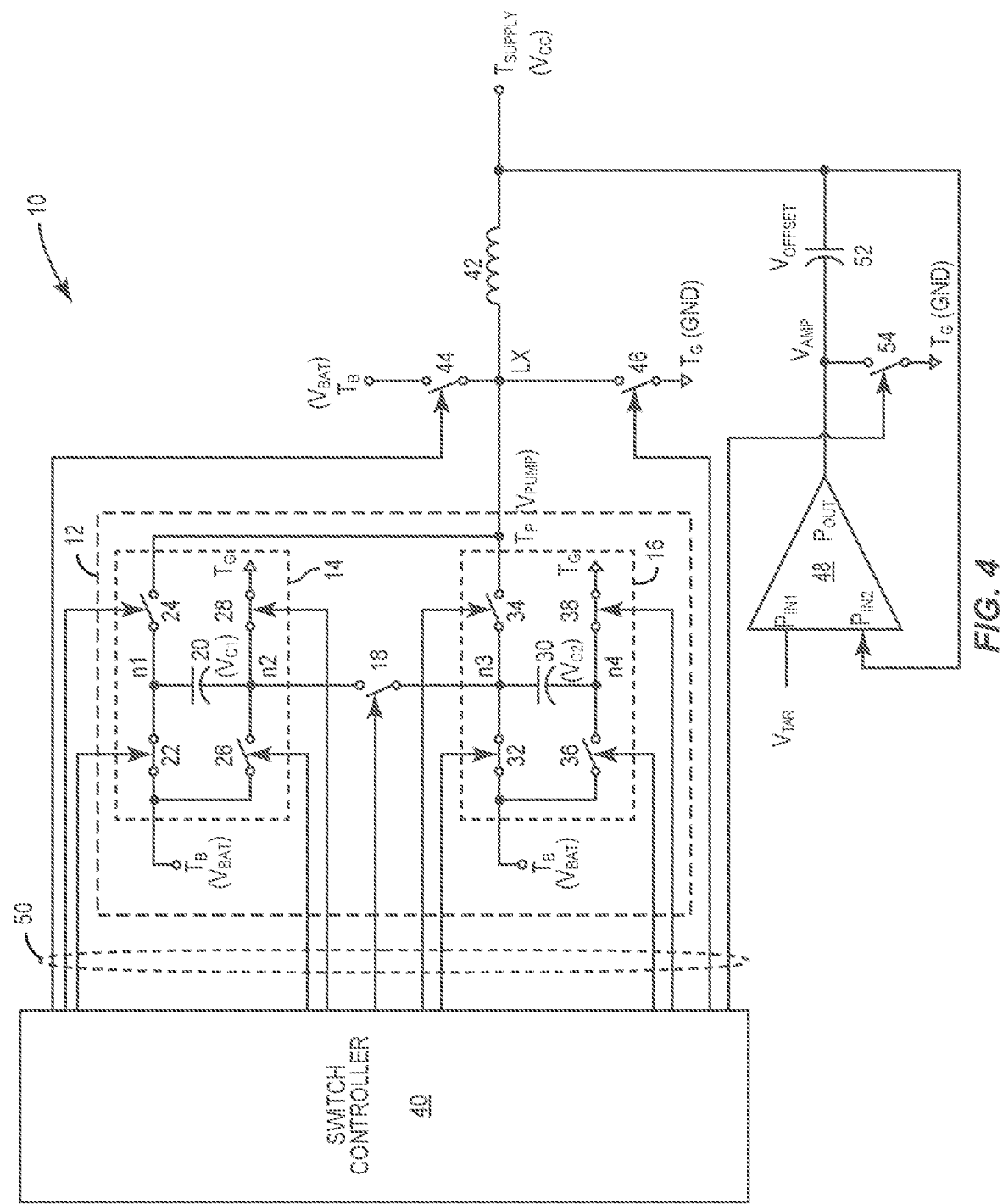

As illustrated in FIG. 2, the first capacitor 20 and the second capacitor 30 are electrically coupled in series, and each is charged at about half the battery voltage $V_{BAT}$ during the charging phase. In another embodiment, the first capacitor 20 and the second capacitor 30 may be electrically coupled in parallel during the charging phase. As illustrated in FIG. 4, the switch controller 40 commands the first switch 22, the fourth switch 28, the fifth switch 32, and the eighth switch 38 to close, and the second switch 24, the third switch 26, the connection switch 18, the sixth switch 34, and the seventh switch 36 to open. As such, the first capacitor 20 and the second capacitor 30 are electrically coupled in parallel and each is between the battery terminal $T_B$ and the ground terminal $T_G$. The battery terminal $T_B$ is connected to the first flying node n1 and the third flying node n3, and the ground terminal $T_G$ is connected to the second flying node n2 and the fourth flying node n4. Each of the first capacitor 20 and the second capacitor 30 will be charged about the same. In this case, the first capacitor voltage Vc1 between the first flying node n1 and the second flying node n2 (across the first capacitor 20) is about the battery voltage $V_{BAT}$, and the second capacitor voltage Vc2 between the third flying node n1 and the fourth flying node n2 (across the second capacitor 30) is also about the battery voltage $V_{BAT}$. During this charging phase, the DCP structure 12 does not provide the charge pump output voltage $V_{PUMP}$ to the interior node LX.

Figure 5A:
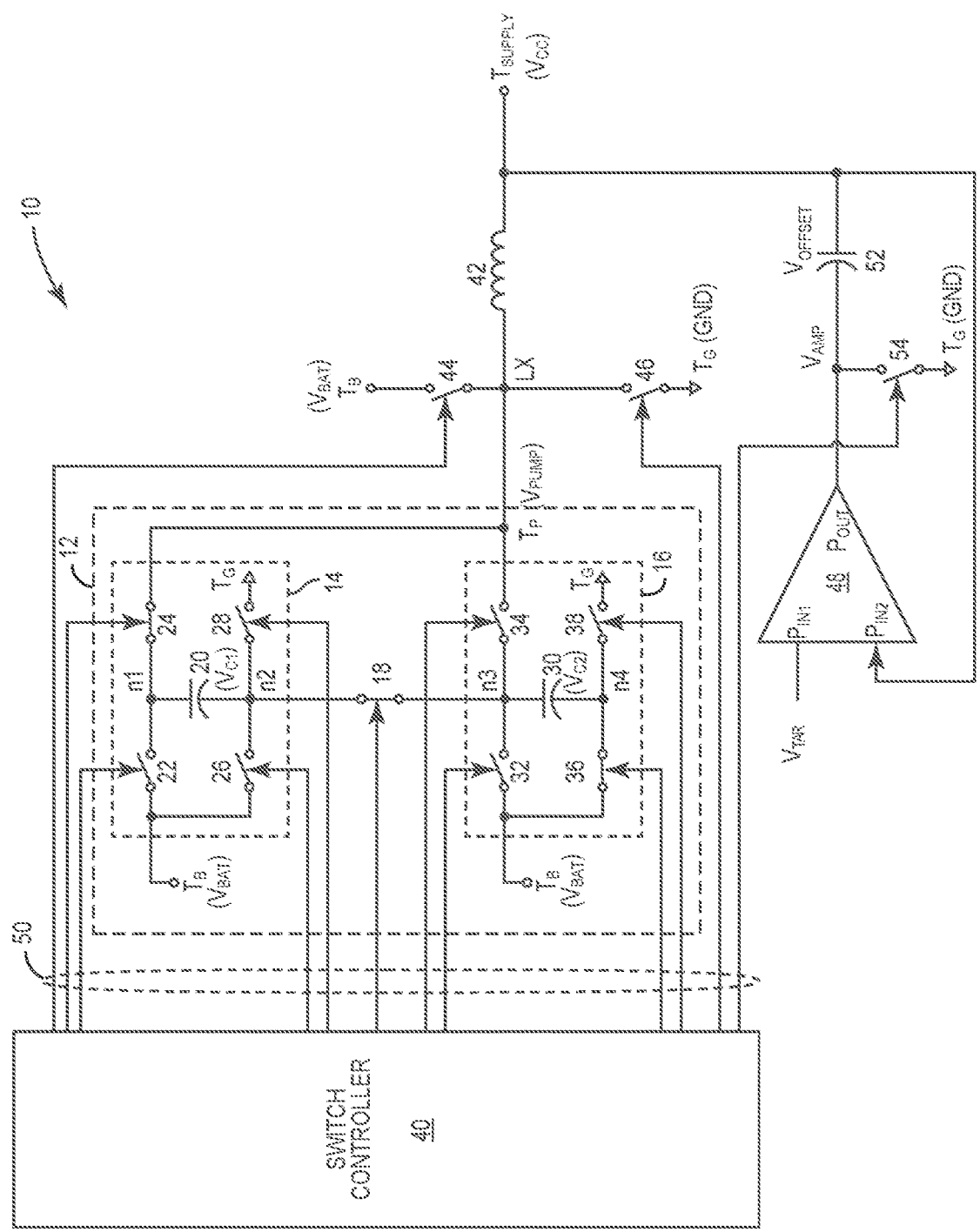

FIG. 5A shows an exemplary configuration of the DCP structure 12 during the discharging phase, after each capacitor 20/30 is charged about the same as the battery voltage $V_{BAT}$. In this embodiment, the switch controller 40 commands the second switch 24, the connection switch 18, and the seventh switch 36 to close, and the first switch 22, the third switch 26, the fourth switch 28, the fifth switch 32, the sixth switch 34, and the eighth switch 38 to open. As such, the first capacitor 20 and the second capacitor 22 are electrically coupled in series between the battery terminal $T_B$ and the pump output terminal T. The fourth flying node n4 is connected to the battery terminal $T_B$, the voltage level at the fourth flying node n4 will change to equal the battery voltage $V_{BAT}$, and the third flying node n3 will be boosted to 2* the battery voltage $V_{BAT}$ (since the second capacitor voltage Vc2 is charged to equal the battery voltage $V_{BAT}$ during the charging phase, and cannot change instantly). The third flying node n3 is connected to the second flying node n2, thus the voltage level at the second flying node n2 is 2* the battery voltage $V_{BAT}$. Consequently, the first flying node n1 will be boosted to 3* the battery voltage $V_{BAT}$ (since the first capacitor voltage Vc1 is charged to equal the battery voltage $V_{BAT}$ during the charging phase, and cannot change instantly). Herein, the first flying node n1 is connected to the pump output terminal $T_P$, such that the charge pump output voltage $V_{PUMP}$ provided at the pump output terminal $T_P$ is about three times the battery voltage $V_{BAT}$.

Figure 5B:
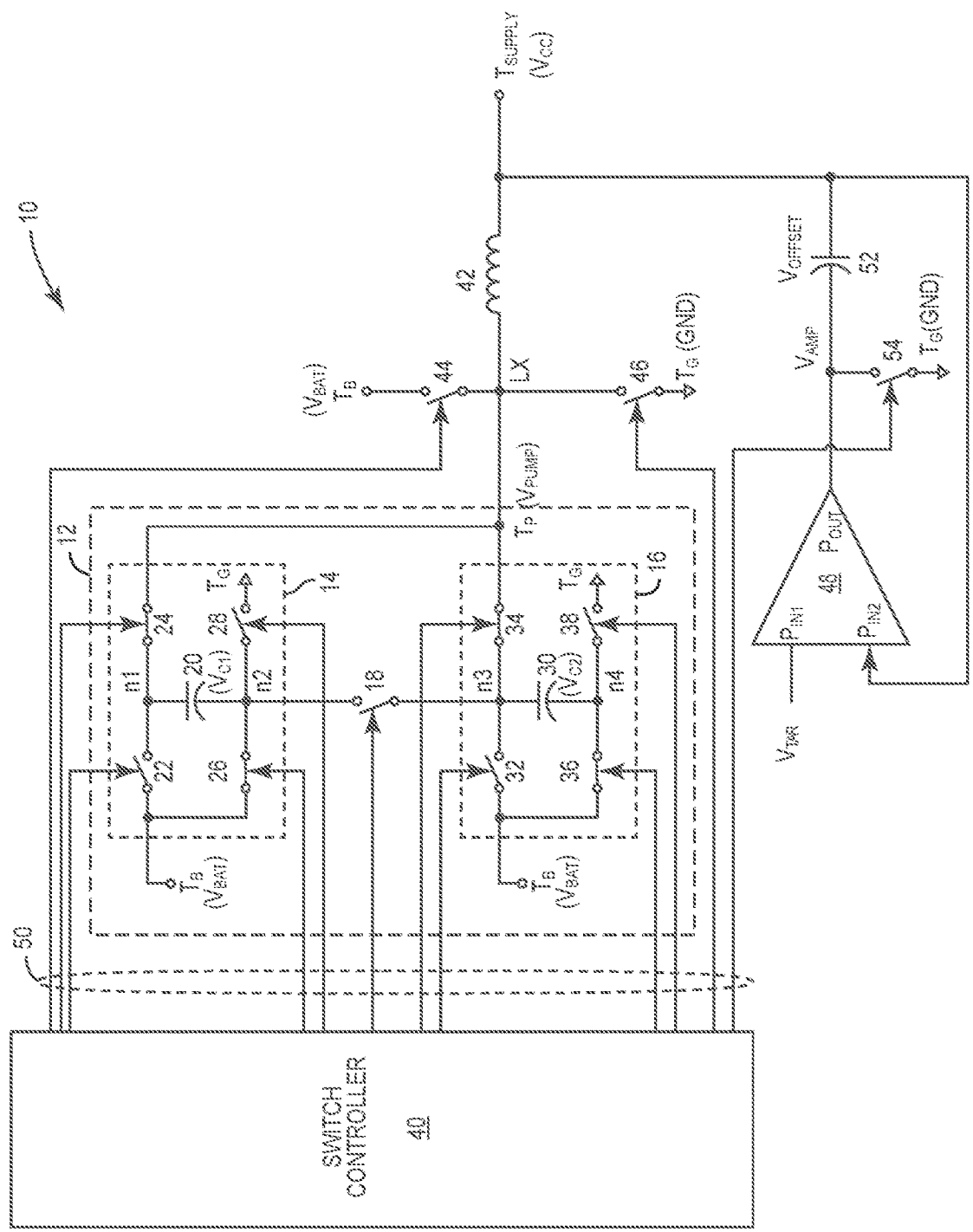

Alternatively, during the discharging phase, the first capacitor 20 and the second capacitor 30 may be electrically coupled in parallel, after each capacitor 20/30 is charged about the same as the battery voltage $V_{BAT}$. As illustrated in FIG. 5B, the switch controller 40 commands the second switch 24, the third switch 26, the sixth switch 34, and the seventh switch 36 to close, and the first switch 22, the fourth switch 28, the connection switch 18, the fifth switch 32, and the eighth switch 38 to open. As such, the first capacitor 20 and the second capacitor 22 are electrically coupled in parallel. Each of the first capacitor 20 and the second capacitor 22 is coupled between the battery terminal $T_B$ and the pump output terminal $T_P$. The second flying node n2 is connected to the battery terminal $T_B$, the voltage level at the second flying node n2 will change to equal the battery voltage $V_{BAT}$, and the first flying node n1 will be boosted to 2* the battery voltage $V_{BAT}$ (since the first capacitor voltage Vc1 is charged to equal the battery voltage $V_{BAT}$ during the charging phase, and cannot change instantly). Similarly, the fourth flying node n4 is connected to the battery terminal $T_B$, the voltage level at the fourth flying node n4 will change to equal the battery voltage $V_{BAT}$, and the third flying node n3 will be boosted to 2* the battery voltage $V_{BAT}$ (since the second capacitor voltage Vc2 is charged to equal the battery voltage $V_{BAT}$ during the charging phase, and cannot change instantly). Herein, the first flying node n1 and the third flying node n3 are connected to the pump output terminal $T_P$, such that the charge pump output voltage $V_{PUMP}$ provided at the pump output terminal $T_P$ is about twice the battery voltage $V_{BAT}$.

Note that during any charging phase (both the second switch 24 and the sixth switch 34 are open), the DCP structure 12 does not provide the charge pump output voltage $V_{PUMP}$ to the interior node LX, and the battery switch 44 or the ground switch 46 may be selected to be closed to maintain current flow through the power inductor 42. During any discharging phase (at least one of the second switch 24 and the sixth switch 34 is closed), the DCP structure 12 is configured to provide the charge pump output voltage $V_{PUMP}$ to the interior node LX, and the battery switch 44 or the ground switch 46 are open.

With different configurations during the charging phase and the discharging phase, the DCP structure 12 is capable of providing various voltage levels of the charge pump output voltage $V_{PUMP}$ to the interior node LX, such as 0.5*$V_{BAT}$, 1.5*$V_{BAT}$, 2*$V_{BAT}$, and 3*$V_{BAT}$. Herein, the flexible voltage levels of the charge pump output voltage $V_{PUMP}$ provided by the DCP structure 12 may enhance the power efficiency of the PMC 10. For instance, when an average voltage level required at the interior node LX is about 1.25 times the battery voltage $V_{BAT}$, utilizing a sequential combination of the battery voltage $V_{BAT}$ (provided from the battery terminal $T_B$ through the battery switch 44) and 1.5*the battery voltage $V_{BAT}$ (provided from the pump output terminal $T_P$) is more efficient than utilizing a sequential combination of the battery voltage $V_{BAT}$ (provided from the battery terminal $T_B$ through the battery switch 44) and 2* the battery voltage $V_{BAT}$ (provided from the pump output terminal $T_P$). If the PMC 10 includes a conventional charge pump, which is configured to provide a fixed voltage level (like 2* $V_{BAT}$), instead of the DCP structure 12, the PMC 10 can only utilize a sequential combination of the battery voltage $V_{BAT}$ and 2* the battery voltage $V_{BAT}$, and cannot improve the power efficiency. In addition, when an average voltage level required at the interior node LX is about 2.5* the battery voltage $V_{BAT}$, the PMC 10 may utilize a sequential combination of the battery voltage $V_{BAT}$ (provided from the battery terminal $T_B$ through the battery switch 44) and 3* the battery voltage $V_{BAT}$ (provided from the pump output terminal $T_P$) to achieve the average voltage level at 2.5* the battery voltage $V_{BAT}$. In contrast, if the PMC 10 includes the conventional charge pump instead of the DCP structure 12, the PMC 10 may never achieve the required voltage level. The PMC 10 with the DCP structure 12 is capable of providing a wide range of voltage levels in an efficient way.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a first switch network comprising a first capacitor;
a second switch network comprising a second capacitor; and
a connection switch coupled between the first switch network and the second switch network, wherein:
the first capacitor and the second capacitor are electrically coupled in series between a battery terminal and a ground terminal or electrically coupled in parallel between the battery terminal and the ground terminal during a charging phase;
the first capacitor and the second capacitor are electrically coupled in series between the battery terminal and a pump output terminal, or electrically coupled in parallel between the battery terminal and the pump output terminal, or electrically coupled in parallel between the ground terminal and the pump output terminal during a discharging phase;
the battery terminal is configured to provide a battery voltage, and the ground terminal is electrically coupled to ground; and
the pump output terminal is configured to provide a charge pump output voltage, which is eligible to be each of a half of, 1.5 times, 2 times, and 3 times the battery voltage.

2. The apparatus of claim 1 wherein:
the first capacitor and the second capacitor are electrically coupled in series between the battery terminal and the ground terminal during the charging phase; and
the first capacitor and the second capacitor are electrically coupled in parallel between the battery terminal and the pump output terminal during the discharging phase.

3. The apparatus of claim 1 wherein:
the first capacitor and the second capacitor are electrically coupled in series between the battery terminal and the ground terminal during the charging phase; and
the first capacitor and the second capacitor are electrically coupled in parallel between the ground terminal and the pump output terminal during the discharging phase.

4. The apparatus of claim 1 wherein:
the first capacitor and the second capacitor are electrically coupled in parallel between the battery terminal and the ground terminal during the charging phase; and
the first capacitor and the second capacitor are electrically coupled in series between the battery terminal and the pump output terminal during the discharging phase.

5. The apparatus of claim 1 wherein:
the first capacitor and the second capacitor are electrically coupled in parallel between the battery terminal and the ground terminal during the charging phase; and
the first capacitor and the second capacitor are electrically coupled in parallel between the battery terminal and the pump output terminal during the discharging phase.

6. The apparatus of claim 1 wherein the first capacitor has a same capacitance as the second capacitor.

7. The apparatus of claim 1 wherein the first switch network further comprises a first switch, a second switch, a third switch, and a fourth switch, wherein:
the first capacitor is coupled between a first flying node and a second flying node;
the first switch is coupled between the battery terminal and the first flying node, such that the battery terminal is connected to the first flying node when the first switch is closed;
the second switch is coupled between the first flying node and the pump output terminal, such that the first flying node is connected to the pump output terminal when the second switch is closed;
the third switch is coupled between the battery terminal and the second flying node, such that the battery terminal is connected to the second flying node when the third switch is closed; and
the fourth switch is coupled between the second flying node and the ground terminal, such that the second flying node is connected to the ground terminal when the fourth switch is closed.

8. The apparatus of claim 7 wherein the second switch network further comprises a fifth switch, a sixth switch, a seventh switch, and an eighth switch, wherein:
the second capacitor is coupled between a third flying node and a fourth flying node;
the fifth switch is coupled between the battery terminal and the third flying node, such that the battery terminal is connected to the third flying node when the fifth switch is closed;
the sixth switch is coupled between the third flying node and the pump output terminal, such that the third flying node is connected to the pump output terminal when the sixth switch is closed;
the seventh switch is coupled between the battery terminal and the fourth flying node, such that the battery terminal is connected to the fourth flying node when the seventh switch is closed; and
the eighth switch is coupled between the fourth flying node and the ground terminal, such that the fourth flying node is connected to the ground terminal when the eighth switch is closed.

9. The apparatus of claim 8 wherein the connection switch is coupled between the second flying node and the third flying node, such that the first capacitor and the second capacitor are coupled in series when the connection switch is closed.

10. The apparatus of claim 9 wherein the connection switch, the first switch, the second switch, the third switch, the fourth switch, the fifth switch, the sixth switch, the seventh switch, and the eighth switch are field-effect transistors (FETs).

11. The apparatus of claim 9 wherein the connection switch, the first switch, the second switch, the third switch, the fourth switch, the fifth switch, the sixth switch, the seventh switch, and the eighth switch are microelectromechanical system switches.

12. The apparatus of claim 9 further comprising a switch controller, which is configured to control the opening and closing of the connection switch, the first switch, the second switch, the third switch, the fourth switch, the fifth switch, the sixth switch, the seventh switch, and the eighth switch.

13. The apparatus of claim 1 further comprising a power inductor coupled between the pump output terminal and a power supply terminal, wherein the power inductor is configured to filter power flowing between the pump output terminal and the power supply terminal.

14. The apparatus of claim 13 further comprising a battery switch and a ground switch, wherein:
the power inductor is coupled to the pump output terminal at an interior node;
the battery switch is coupled between the battery terminal and the interior node, such that the battery terminal is electrically coupled to the power inductor when the battery switch is closed; and the ground switch is coupled between the interior node and ground, such that the ground terminal is electrically coupled to the power inductor when the ground switch is closed.

15. The apparatus of claim 14 further comprising a switch controller, which is configured to conduct current to the power inductor from one of the pump output terminal, the battery terminal, and the ground terminal.

16. The apparatus of claim 13 further including a tracking amplifier comprising:
   a first input port coupled to the power supply terminal to receive a feedback signal;
   a second input port configured to receive a target voltage; and
   an output port coupled to the power supply terminal, wherein the tracking amplifier is configured to provide an amplified voltage in response to a difference between the target voltage and the feedback signal.

17. The apparatus of claim 16 further including an offset capacitor coupled between the output port of the tracking amplifier and the power supply terminal, wherein the offset capacitor is configured to provide an offset voltage to increase a dynamic range of the amplified voltage.

18. The apparatus of claim 16 further comprising a mode switch coupled between the output port of the tracking amplifier and the ground terminal, wherein the mode switch is configured to enable or disable the tracking amplifier.

19. The apparatus of claim 18 further comprising a switch controller, which is configured to control the opening and closing of the mode switch.

* * * * *

UNITED STATES PATENT AND TRADEMARK OFFICE
CERTIFICATE OF CORRECTION

PATENT NO. : 10,879,795 B2
APPLICATION NO. : 16/662699
DATED : December 29, 2020
INVENTOR(S) : Nadim Khlat Page 1 of 1

It is certified that error appears in the above-identified patent and that said Letters Patent is hereby corrected as shown below:

In the Specification

Column 7, Line 24, replace "$P_{1N2}$" with --$P_{IN2}$--.

Column 9, Line 34, replace "terminal T" with --terminal $T_P$--.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*